United States Patent
Yamazaki

(10) Patent No.: US 9,548,214 B2
(45) Date of Patent: Jan. 17, 2017

(54) PLASMA ETCHING METHOD OF MODULATING HIGH FREQUENCY BIAS POWER TO PROCESSING TARGET OBJECT

(71) Applicant: Tokyo Electron Limited, Tokyo (JP)

(72) Inventor: Fumio Yamazaki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/970,671

(22) Filed: Dec. 16, 2015

(65) Prior Publication Data

US 2016/0181119 A1 Jun. 23, 2016

(30) Foreign Application Priority Data

Dec. 18, 2014 (JP) .................................. 2014-256635

(51) Int. Cl.
| | |
|---|---|
| H01L 21/311 | (2006.01) |
| H01L 21/3065 | (2006.01) |
| H01L 21/3213 | (2006.01) |
| H01J 37/32 | (2006.01) |

(52) U.S. Cl.
CPC .... H01L 21/31116 (2013.01); H01J 37/32146 (2013.01); H01J 37/32165 (2013.01); H01L 21/3065 (2013.01); H01L 21/30655 (2013.01); H01L 21/31144 (2013.01); H01L 21/32137 (2013.01)

(58) Field of Classification Search
CPC ....................... H01L 21/3065; H01L 21/30655
See application file for complete search history.

(56) References Cited

U.S. PATENT DOCUMENTS

| | | | | |
|---|---|---|---|---|
| 2008/0110859 A1* | 5/2008 | Koshiishi | .......... | H01J 37/32027 216/67 |
| 2010/0213162 A1* | 8/2010 | Mochiki | .......... | H01J 37/32027 216/17 |
| 2012/0171869 A1* | 7/2012 | Morikawa | ......... | H01L 21/30655 438/703 |
| 2013/0023064 A1* | 1/2013 | Marakhtanov | .... | H01J 37/32091 438/5 |
| 2015/0126033 A1* | 5/2015 | LeFevre | ............ | H01L 21/30655 438/694 |
| 2015/0235862 A1* | 8/2015 | Takahashi | ......... | H01L 21/31116 438/714 |

FOREIGN PATENT DOCUMENTS

JP 3681533 B 5/2005

* cited by examiner

*Primary Examiner* — Michael Jung
(74) *Attorney, Agent, or Firm* — Pearne & Gordon LLP

(57) ABSTRACT

A plasma etching method includes a first process of applying, while applying a first high frequency power to a lower electrode, a second high frequency power to the lower electrode while switching the second high frequency power ON and OFF cyclically; and a second process of applying, while applying the first high frequency power to the lower electrode, the second high frequency power to the lower electrode while maintaining the second high frequency power ON continuously. The first process and the second process are alternately performed. If the deposits are formed on a bottom portion of an inner surface of the hole formed by the etching, the inner surface of the hole is protected by the deposits from the ions introduced into the hole. Therefore, the etching of the inner surface of the hole can be suppressed, and, thus, the twisting of the hole can also be suppressed.

7 Claims, 6 Drawing Sheets

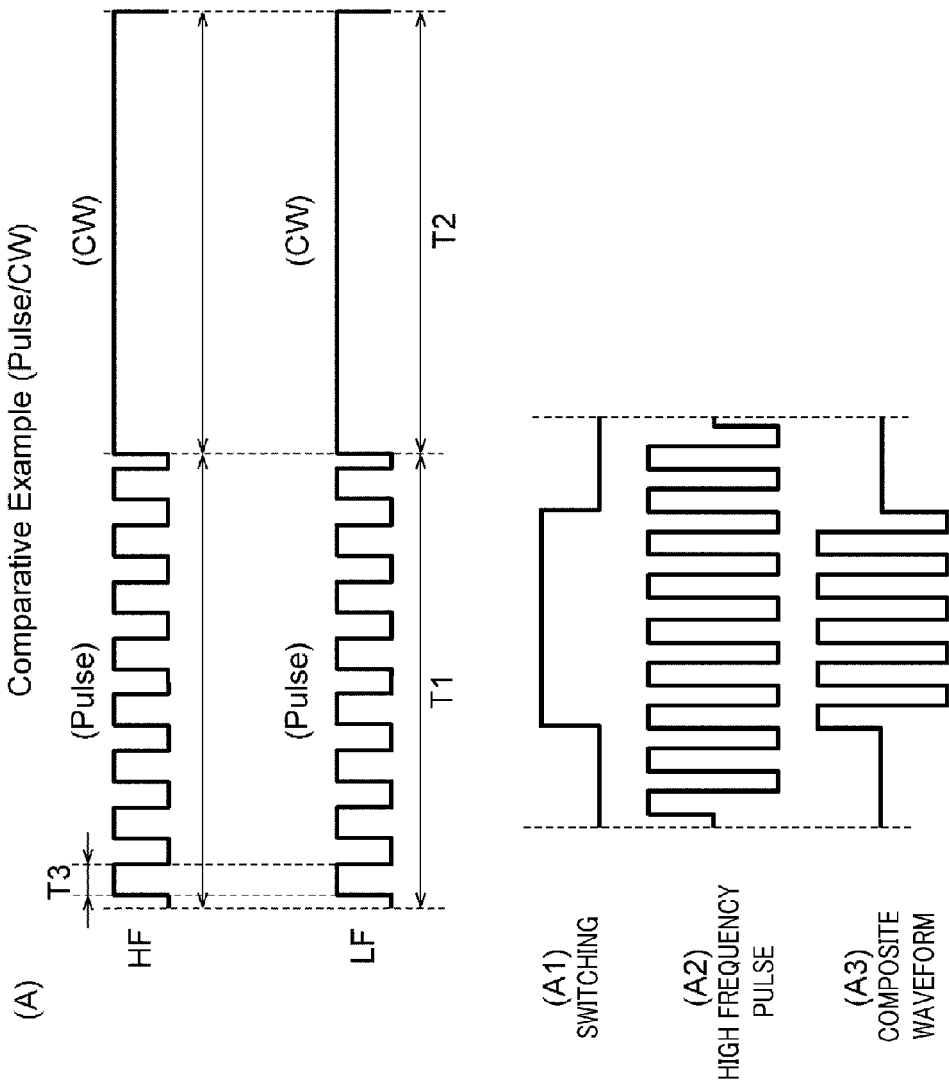

CxFy → CF,CF2,CF3,F
(High → Low sticking coefficient)

Non uniform side wall polymer $C_xF_y$ + CF, CF2, CF3, F
(High + Low sticking coefficient)

Uniform side wall polymer

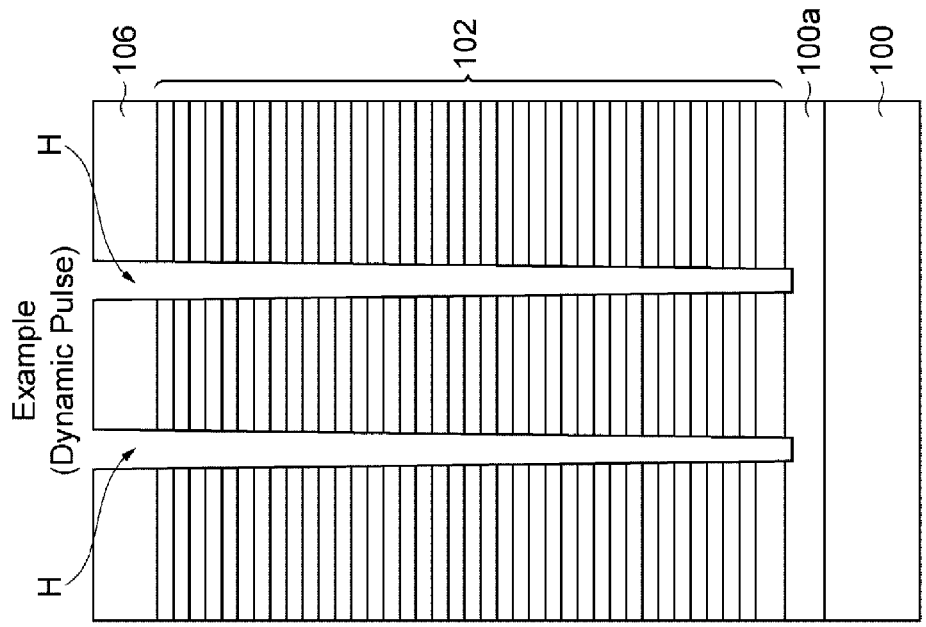
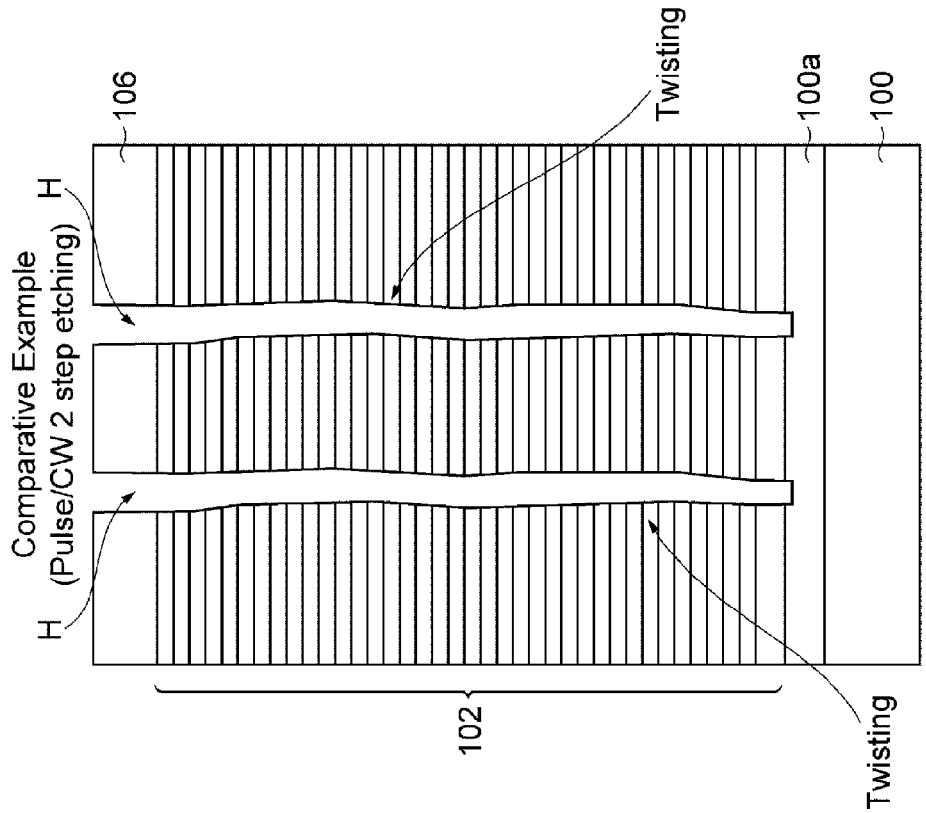

PLASMA ETCHING METHOD OF MODULATING HIGH FREQUENCY BIAS POWER TO PROCESSING TARGET OBJECT

CROSS-REFERENCE TO RELATED APPLICATION

This application claims the benefit of Japanese Patent Application No. 2014-256635 filed on Dec. 18, 2014, the entire disclosures of which are incorporated herein by reference.

TECHNICAL FIELD

The embodiments described herein pertain generally to a plasma etching method.

BACKGROUND

Conventionally, there is known a plasma etching method (for example, Patent Document 1). In this plasma etching method, a processing gas containing fluorocarbon is introduced into a processing vessel in which a processing target object is provided, and a first high frequency power for exciting the processing gas into plasma and a second high frequency power for attracting ions to the processing target object are applied between electrodes within the processing vessel. The second high frequency power has a frequency lower than that of the first high frequency power, and the processing target object is etched by the generated plasma.

Patent Document 1: Japanese Patent No. 3,681,533

When forming a deep hole or groove by plasma etching (comparative example: FIG. 6A), however, twisting of a hole H is observed. In the comparative example, a two-step etching process is performed by using hexafluoro-1,3-butadiene ($C_4F_6$), difluoromethane ($CH_2F_2$), oxygen ($O_2$) and carbon monoxide (CO) as a processing gas. In a first process, while applying the first high frequency power to an electrode, the second high frequency power is applied to the electrode while being switched ON and OFF cyclically. In a second process, while applying the first high frequency power to the electrode, the second high frequency power is applied to the electrode while being maintained ON continuously. In the respective processes, the ON/OFF switching of the first high frequency power is synchronized with the ON/OFF switching of the second high frequency power.

SUMMARY

In view of the foregoing, exemplary embodiments provide a plasma etching method capable of suppressing a twisting of a hole or a groove formed by etching.

In one exemplary embodiment, there is provided a plasma etching method of introducing a processing gas containing fluorocarbon into a processing vessel in which a processing target object is provided; applying a first high frequency power (having a frequency appropriately selected within a range from 27 MHz to 100 MHz) for excitation of the processing gas into plasma and a second high frequency power (having a frequency appropriately selected within a range from 400 kHz to 13.56 MHz) for attraction of ions to the processing target object, which has a frequency lower than a frequency of the first high frequency power, between electrodes within the processing vessel; and etching the processing target object by the generated plasma. The plasma etching method includes a first process of applying, while applying the first high frequency power to the electrode, the second high frequency power to the electrode while switching ON/OFF of the second high frequency power cyclically; and a second process of applying, while applying the first high frequency power to the electrode, the second high frequency power to the electrode while maintaining the second high frequency power ON continuously. Further, the processing target object includes a multilayered film in which a first film and a second film having different permittivities are alternately stacked on top of each other; and a mask formed on the multilayered film. Moreover, the first process and the second process are alternately performed such that deposits, which are originated from the processing gas and stuck to an inner surface of a hole or a groove formed by the etching, are uniformly formed from a vicinity of a top portion of the opening to the a bottom portion thereof.

In this method, if deposits are formed on the inner surface of the hole or the groove formed by the etching, the inner surface of the hole or the groove is protected by the deposits from ions introduced into the hole or the groove, so that the etching of the inner surface (sidewall surface) of the hole or the groove is suppressed, and the twisting of the hole or the groove can be suppressed.

A first period during which the first process is performed and a second period during which the second process is performed may be set to have a range from 10 sec to 60 sec and have a range from 10 sec to 60 sec, respectively. According to the present exemplary embodiment, the inner surface of the hole or the groove is protected from the ions introduced therein, so that the etching of the inner surface (sidewall surface) of the hole or the groove can be suppressed, and the twisting of the hole or the groove can be suppressed.

The processing gas containing the fluorocarbon may contain a $C_4F_6$ gas, a $CH_2F_2$ gas and an $O_2$ gas.

ON/OFF switching of the first high frequency power may be synchronized with ON/OFF switching of the second high frequency power in the first process and the second process. In this case, plasma can be stabilized, as compared to a case where the ON/OFF switching of the first high frequency power is not synchronized with the ON/OFF switching of the second high frequency power.

The first film may be a silicon oxide film, and the second film may be a silicon nitride film. Further, the first film may be a silicon oxide film, and the second film may be a polysilicon film. Furthermore, the first film and the second film may be stacked in twenty four layers or more in total. Moreover, the mask may be made of amorphous carbon.

According to the exemplary embodiments, it is possible to suppress the twisting of a hole or a groove formed by etching.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 2 provides a timing chart (A) of high frequency powers (envelope curves of a composite waveform), and a timing chart of a switching pulse (A1), a high frequency pulse (A2) applied during a switching operation and a composite waveform (A3) of the switching pulse and the high frequency pulse in a plasma etching method according to a comparative example;

FIG. 6A and FIG. 6B are longitudinal profiles of a processing target object showing etching states according to the comparative example and the exemplary embodiment, respectively.

DETAILED DESCRIPTION

Figure 1:
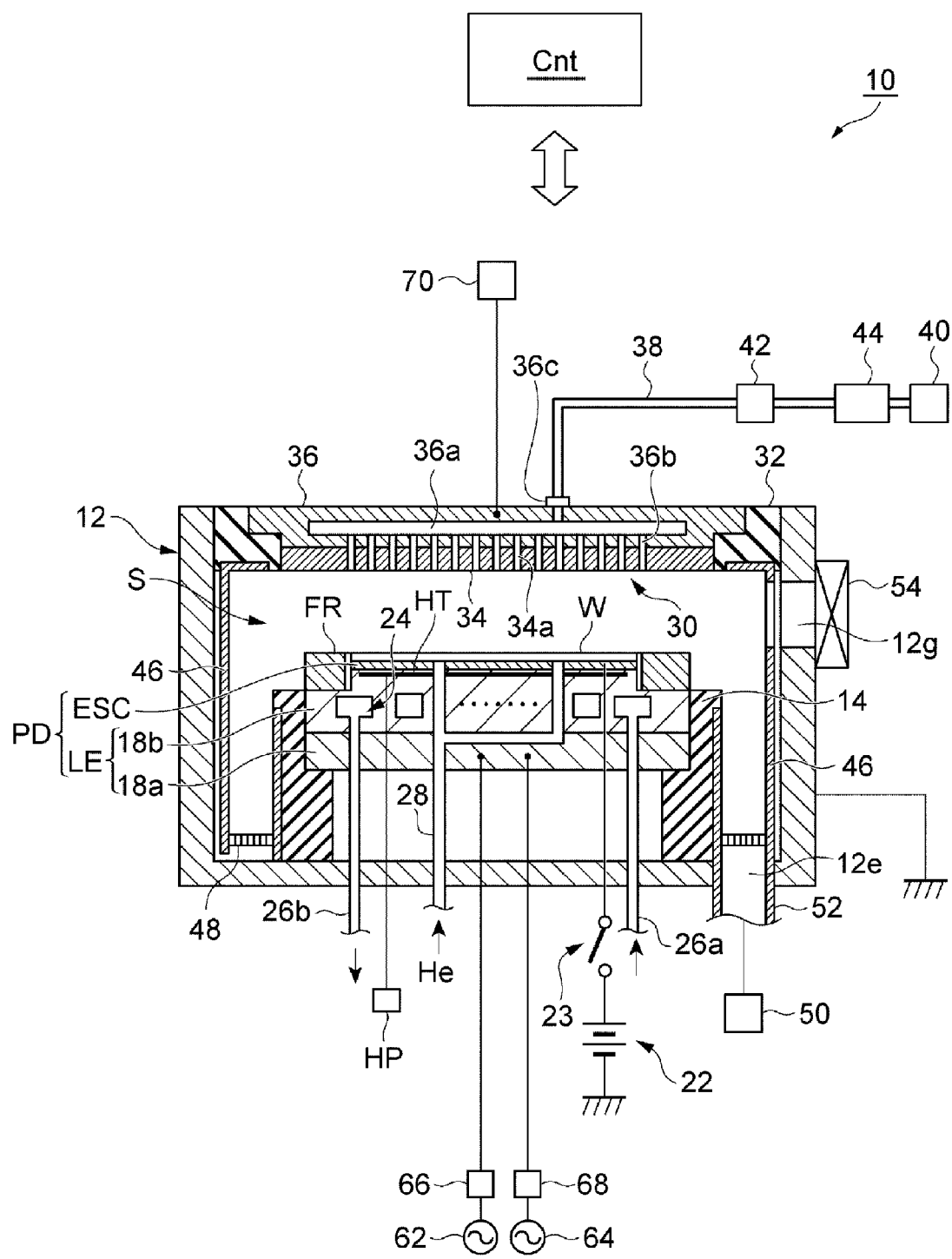
FIG. 1 is a schematic diagram illustrating a plasma processing apparatus (plasma etching apparatus)

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a schematic diagram illustrating a plasma processing apparatus configured to perform a plasma etching method according to an exemplary embodiment.

As depicted in FIG. 1, the plasma processing apparatus 10 is configured as a capacitively coupled plasma etching apparatus, and includes a processing vessel 12. The processing vessel 12 has a substantially cylindrical shape. The processing vessel 12 is made of, but not limited to, aluminum, and an inner wall surface thereof is anodically oxidized. This processing vessel 12 is frame-grounded.

A substantially cylindrical supporting member 14 is provided on a bottom portion of the processing vessel 12. The supporting member 14 is made of, by way of non-limiting example, an insulating material. Within the processing vessel 12, the supporting member 14 is vertically extended from the bottom portion of the processing vessel 12. Furthermore, a mounting table PD is provided within the processing vessel 12. The mounting table PD is supported by the supporting member 14.

The mounting table PD is configured to hold a wafer W as a processing target object on a top surface thereof. The mounting table PD has a lower electrode LE and an electrostatic chuck ESC. The lower electrode LE is provided with a first plate 18a and a second plate 18b. The first plate 18a and the second plate 18b are made of a metal such as, but not limited to, aluminum, and each thereof has a substantially disk shape. The second plate 18b is provided on the first plate 18a and electrically connected with the first plate 18a.

The electrostatic chuck ESC is provided on the second plate 18b. The electrostatic chuck ESC includes a pair of insulating films or insulating sheets; and an electrode embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W thereon.

A focus ring FR is provided on a peripheral portion of the second plate 18b to surround an edge of the wafer W and the electrostatic chuck ESC. The focus ring FR is provided to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature controller. A coolant is supplied into the coolant path 24 from a chiller unit provided outside the processing vessel 12 via a pipeline 26a. The coolant supplied into the coolant path 24 is then returned back into the chiller unit via a pipeline 26b. In this way, the coolant is supplied into and circulated through the coolant path 24. A temperature of the wafer W held by the electrostatic chuck ESC is controlled by adjusting a temperature of the coolant.

Furthermore, the plasma processing apparatus 10 is provided with a gas supply line 28. The gas supply line 28 supplies a heat transfer gas, e.g., a He gas, from a heat transfer gas supply device into a gap between a top surface of the electrostatic chuck ESC and a rear surface of the wafer W.

The plasma processing apparatus 10 is also equipped with a heater HT as a heating device. The heater HT is embedded in, for example, the second plate 18b, and is connected to a heater power supply HP. As a power is supplied to the heater HT from the heater power supply HP, the temperature of the mounting table PD is adjusted, and, thus, the temperature of the wafer W placed on the mounting table PD can be adjusted. Alternatively, the heater HT may be embedded in the electrostatic chuck ESC.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other, so that a parallel plate type plasma processing apparatus is provided. Provided between the upper electrode 30 and the lower electrode LE is a processing space S in which a plasma process is performed on the wafer W.

The upper electrode 30 is supported at an upper portion of the processing vessel 12 with an insulating shield member 32 therebetween. In the exemplary embodiment, the upper electrode 30 may be configured to have a variable distance in a vertical direction from a top surface of the mounting table PD, i.e., a wafer mounting surface. The upper electrode 30 may include an electrode plate 34 and an electrode supporting body 36. The electrode plate 34 faces the processing space S and is provided with a multiple number of gas discharge holes 34a. In the exemplary embodiment, the electrode plate 34 is made of silicon.

The electrode supporting body 36 is configured to support the electrode plate 34 in a detachable manner, and is made of a conductive material such as, but not limited to, aluminum. The electrode supporting body 36 may have a water-cooling structure. A gas diffusion space 36a is formed within the electrode supporting body 36. A multiple number of gas through holes 36b is extended downwards from the gas diffusion space 36a, and these gas through holes 36b respectively communicate with the gas discharge holes 34a. Further, the electrode supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources. The gases sources may include one or more sources of a fluorocarbon gas, a source of an oxygen gas ($O_2$ gas), and a source of a rare gas. The fluorocarbon gas may be a gas including at least one of $C_4F_6$, $C_4F_8$, and $C_6F_6$. In one exemplary embodiment, the gas sources may include a source of the $C_4F_6$ gas and a source of the $C_4F_8$ gas. Further, the source of the rare gas may be a source of the rare gas such as an Ar gas or a He gas.

The valve group 42 includes a multiplicity of valves, and the flow rate controller group 44 includes multiple flow rate controllers such as mass flow controller. Each of the gas sources belonging to the gas source group 40 is connected to the gas supply line 38 via each corresponding valve belonging to the valve group 42 and each corresponding flow rate controller belonging to the flow rate controller group 44.

Furthermore, in the plasma processing apparatus 10, a deposition shield 46 is detachably provided along an inner wall of the processing vessel 12. The deposition shield 46 is also provided on an outer side surface of the supporting member 14. The deposition shield 46 is configured to suppress an etching byproduct (deposit) from adhering to the processing vessel 12, and is formed by coating an aluminum member with ceramics such as $Y_2O_3$.

A gas exhaust plate 48 is provided at a bottom portion of the processing vessel 12 and provided between the supporting member 14 and the inner wall of the processing vessel 12. The gas exhaust plate 48 may be made of, by way of example, an aluminum member coated with ceramic such as $Y_2O_3$. The processing vessel 12 is also provided with a gas exhaust opening 12e under the gas exhaust plate 48, and the gas exhaust opening 12e is connected with a gas exhaust device 50 via a gas exhaust line 52. The gas exhaust device 50 includes a vacuum pump such as a turbo molecular pump and is capable of depressurizing the inside of the processing vessel 12 to a desired vacuum level. Further, a carry-in/out opening 12g for the wafer W is formed through a sidewall of the processing vessel 12, and this carry-in/out opening 12g is opened or closed by a gate valve 54.

The plasma processing apparatus 10 further includes a first high frequency power supply 62 and a second high frequency power supply 64. The first high frequency power supply 62 is configured to generate a first high frequency power for plasma generation. That is, the first high frequency power supply 62 generates a high frequency power having a frequency in a range from 27 MHz to 100 MHz, e.g., 40 MHz. The first high frequency power supply 62 is connected to the lower electrode LE via a matching device 66. The matching device 66 is a circuit for matching an output impedance of the first high frequency power supply 62 and an input impedance on a load side (lower electrode LE).

The second high frequency power supply 64 is configured to generate a second high frequency power for ion attraction into the wafer W, i.e., a high frequency bias power having a frequency in a range from 400 kHz to 13.56 MHz, e.g., 3.2 MHz. The second high frequency power supply 64 is connected to the lower electrode LE via a matching device 68. The matching device 68 is a circuit for matching an output impedance of the second high frequency power supply 64 and the input impedance on the load side (lower electrode LE).

The plasma processing apparatus 10 further includes a power supply 70. The power supply 70 is connected to the upper electrode 30. The power supply 70 is configured to apply, to the upper electrode 30, a voltage for attracting positive ions existing within the processing space S to the electrode plate 34. In the exemplary embodiment, the power supply 70 is a DC power supply configured to generate a negative DC voltage. As another example, the power supply 70 may be an AC power supply configured to generate an AC voltage having a relatively low frequency. The voltage applied from the power supply 70 to the upper electrode 30 may be equal to or less than −150 V. That is, the voltage applied to the upper electrode 30 from the power supply 70 may be a negative voltage having an absolute value of 150 V or larger. If such a voltage is applied from the power supply 70 to the upper electrode 30, the positive ions existing within the processing space S collide with the electrode plate 34. As a result, secondary electrons and/or silicon are emitted from the electrode plate 34.

Furthermore, according to the exemplary embodiment, the plasma processing apparatus 10 further includes a controller Cnt. The controller Cnt is a computer including a processor, a memory unit, an input device, a display device, and so forth, and is configured to control individual components of the plasma processing apparatus 10. To be specific, the controller Cnt is connected to the valve group 42, the flow rate controller group 44, the gas exhaust device 50, the first high frequency power supply 62, the matching device 66, the second high frequency power supply 64, the matching device 68, the power supply 70, the heater power supply HP and the chiller unit.

The controller Cnt is operated according to a program based on inputted recipes, and sends control signals. In response to the control signals from the controller Cnt, selection of a gas supplied from the gas source group and a flow rate of the selected gas, a gas exhaust by the gas exhaust device 50, power supplies from the first and second high frequency power supplies 62 and 64, a voltage application from the power supply 70, a power supply from the heater power supply HP, a flow rate and a temperature of a coolant from the chiller unit can be controlled.

Etching is performed as follows, by using the above-described plasma processing apparatus.

First, a processing target object is prepared. As illustrated in FIG. 6A and FIG. 6B, the processing target object is a wafer having, on a support substrate 100, an underlying layer 100a, an etching target layer 102 and a mask 106 in this sequence. The etching target layer 102 has a multilayered structure, and materials thereof are not particularly limited. In the present exemplary embodiment, a multilayered structure in which a silicon oxide film ($SiO_2$) (first film) and a silicon nitride film (SiN) (second film) are alternately stacked is used as the etching target layer 102. The first film and the second film may be stacked in twenty four (24) layers or more in total. In the present exemplary embodiment, the support substrate 100 is made of silicon; the underlying layer 100a, polysilicon; and the mask 106, amorphous carbon. However, the materials thereof are not limited thereto, and other materials may be used. In the comparative example and the exemplary embodiment, hexafluoro-1,3-butadiene ($C_4F_6$), difluoromethane ($CH_2F_2$), oxygen ($O_2$) and carbon monoxide (CO) are used as the processing gas, and flow rates of the $C_4F_6$, the $CH_2F_2$ and the $O_2$ are respectively set to be in a range from 50 sccm to 100 sccm, and a flow rate of the CO is set to be in a range from 0 sccm to 20 sccm.

Comparative Example

In the comparative example of FIG. 6A, thicknesses of the etching target layer 102 and the mask 106 are set to be in a range from 1 μm to 3 μm and in a range from 1 μm to 2 μm, respectively, and an opening of the mask is set to be of a circular shape having a diameter ranging from 50 nm to 100 nm. Further, high frequency powers are applied under the condition shown in (A) of FIG. 2. (A) of FIG. 2 provides a timing chart of the high frequency powers in the plasma etching method according to the comparative example, and an upper side of a vertical axis indicates an ON state of the high frequency power, whereas a lower side of the vertical axis indicates an OFF state thereof. Here, HF indicates a switching state of the first high frequency power, and LF indicates a switching state of the second high frequency power.

Further, (A) of FIG. 2 illustrates the high frequency powers (envelope curves of a composite waveform) in the plasma etching method. This composite waveform is a synthesis of a switching pulse ((A1) of FIG. 2) of the high frequency power and a high frequency pulse ((A2) of FIG. 2) applied during a switching operation, as shown in (A3) of FIG. 2. That is, the high frequency powers (frequencies of the first and second high frequency powers) of the high frequency pulse ((A2) of FIG. 2) are applied only during a period while the switching pulse ((A1) of FIG. 2) is ON.

In the comparative example, a two-step etching process is performed.

In a first process (during a first period T1 of (A) of FIG. 2), while applying the first high frequency power to the lower electrode LE from the first high frequency power supply 62, the second high frequency power is applied to the lower electrode LE from the second high frequency power supply 64 while being switched ON and OFF cyclically. Here, processing conditions are set to be T1=8 min, T2=4 min, and Temperature=30° C. Further, the first period T1 is a time period that starts from a low level (OFF) and finally ends at the low level (OFF) after a high level (ON) and the low level (OFF) are repeated cyclically.

A frequency of the first high frequency power for excitation of the processing gas into plasma is set to, e.g., 40 MHz (appropriately, selected within a range from 27 MHz to 100 MHz), and a frequency of the second high frequency power is set to be 3.2 MHz (appropriately, selected within a range from 400 kHz to 13.56 MHz).

In a second process (during a second period T2 of (A) of FIG. 2), while applying the first high frequency power to the lower electrode LE from the first high frequency power supply 62, the second high frequency power is applied to the lower electrode LE from the second high frequency power supply 64 while being maintained ON continuously. Further, the second period T2 is a time period that starts from a time point when the low level (OFF) is turned into the high level (ON) and finally ends at a time point when the high level (ON) is turned into the low level (OFF) after the high level (ON) is maintained.

In the first process and the second process, the ON/OFF switching of the first high frequency power is synchronized with the ON/OFF switching of the second high frequency power. Accordingly, the first high frequency power is applied to the lower electrode LE in the first process while being switched ON and OFF cyclically, whereas the first high frequency power is applied to the lower electrode in the second process while being maintained ON continuously.

When switching the high frequency powers ON and OFF cyclically as described above, a switching frequency is set to be in a range from 5 kHz to 30 kHz (in the present exemplary embodiment, 5 kHz), and a duty ratio is set to be in a range from 20% to 90% (in the present exemplary embodiment, 30%).

Exemplary Embodiment

Figure 4:
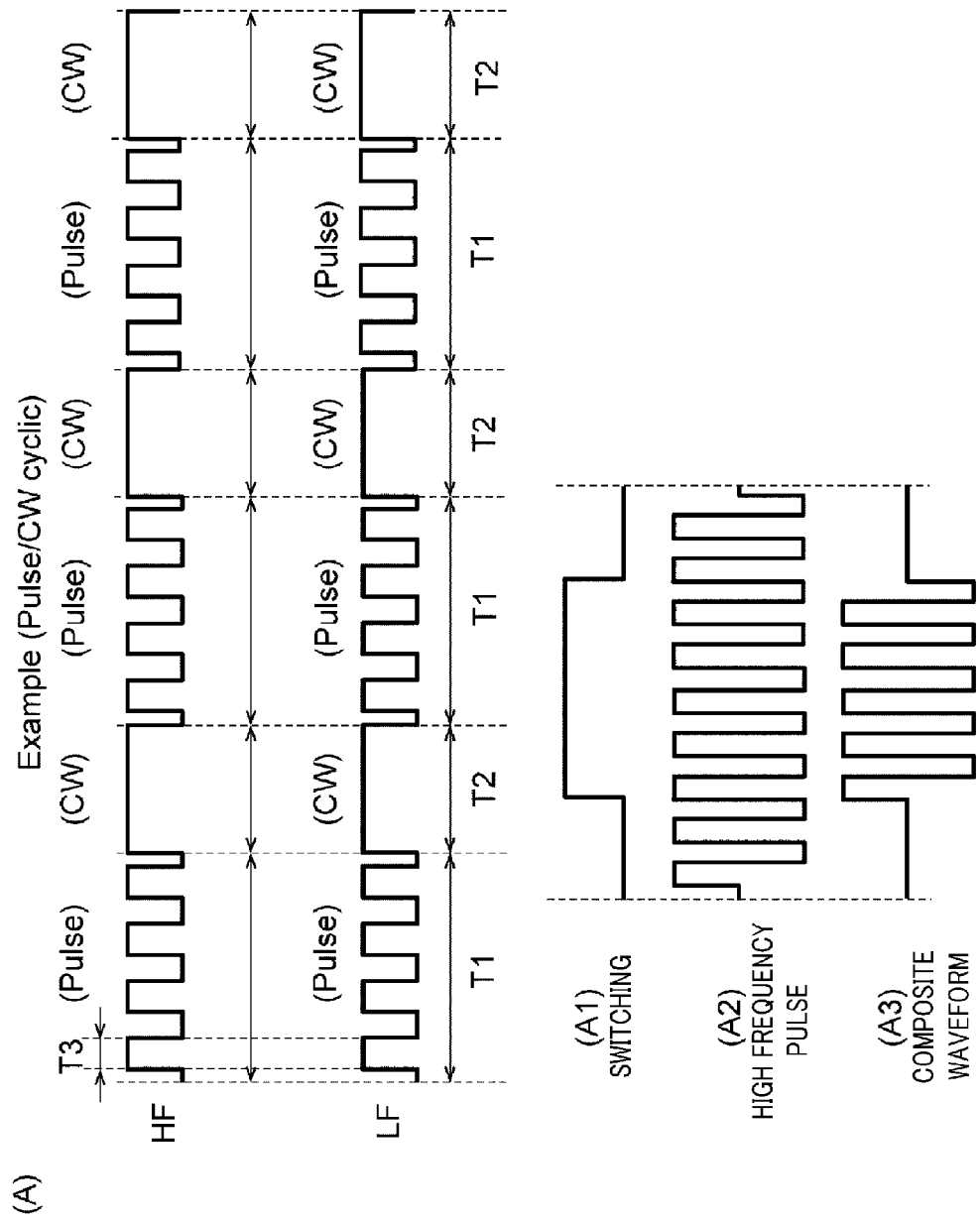
FIG. 4 provides a timing chart (A) of high frequency powers (envelope curves of a composite waveform), and a timing chart of a switching pulse (A1), a high frequency pulse (A2) applied during a switching operation and a composite waveform (A3) of the switching pulse and the high frequency pulse in a plasma etching method according to an exemplary embodiment.

In the exemplary embodiment shown in FIG. 4, processing conditions including a structure of a processing target object, a processing gas, and so forth are the same as those of the comparative example except for a supply condition of the high frequency powers.

Further, (A) of FIG. 4 depicts the high frequency powers (envelope curves of a composite waveform) in a plasma etching method. This composite waveform is a synthesis of a switching pulse ((A1) of FIG. 4) of the high frequency power and a high frequency pulse ((A2) of FIG. 4) applied during a switching operation, as shown in (A3) of FIG. 4. That is, the high frequency powers of the high frequency pulse ((A2) of FIG. 4) are applied only during a period while the switching pulse ((A1) of FIG. 4) is ON.

The first period T1 in the exemplary embodiment and in the comparative example includes a period during which the switching is intermittently OFF (that is, a period during which plasma is not excited). A period T3 in (A) of FIG. 2 and in (A) of FIG. 4 represents a single pulse width, and there is established a relationship of T3<T2. During the period T3, plasma is continuously excited cyclically (intermittently) by the high frequency power. That is, when an amplitude of the high frequency power has a large value (maximum value), the plasma is generated, whereas when the amplitude of the high frequency power has a small value (minimum value), the plasma is extinguished. Furthermore, the plasma is extinguished during the other periods within the first period T1 than the period T3. The first period T1 includes a multiple number of periods T3.

In the exemplary embodiment, there is performed an etching process in which a first process and a second process are switched alternately (hereinafter, referred to as "dynamic-pulse etching"), as depicted in FIG. 4.

In the first process (during the period T1 in (A) of FIG. 4), while applying the first high frequency power to the lower electrode LE from the first high frequency power supply 62, the second high frequency power is applied to the lower electrode LE from the second high frequency power supply 64 while being switched ON and OFF cyclically. Here, the first period T1 is a time period that starts from a low level (OFF) and finally ends at the low level (OFF) after a high level (ON) and the low level (OFF) are repeated cyclically.

A frequency of the first high frequency power for excitation of the processing gas into plasma is set to, e.g., 40 MHz (appropriately, selected within a range from 27 MHz to 100 MHz), and a frequency of the second high frequency power is set to be 3.2 MHz (appropriately, selected within a range from 400 kHz to 13.56 MHz).

In the second process (during the second period T2 of (A) of FIG. 4), while applying the first high frequency power to the lower electrode LE from the first high frequency power supply 62, the second high frequency power is applied to the lower electrode LE from the second high frequency power supply 64 while being maintained ON continuously. Further, the first period T1 during which the first process is performed is set to be in a range from 10 sec to 60 sec (T1=10 sec~60 sec), and the second period T2 during which the second process is performed is also set to be in a range from 10 sec to 60 sec (T2=10 sec~60 sec). According to the present exemplary embodiment, an inner surface of a hole or a groove is protected from ions attracted into the hole or the groove, so that etching of the inner surface (sidewall surface) of the hole or the groove is suppressed and the twisting thereof is suppressed. Furthermore, the second period T2 is a time period that starts from a time point when the low level (OFF) is turned into the high level (ON) and finally ends at a time point when the high level (ON) is turned into the low level (OFF) after the high level (ON) is maintained.

In the first process and the second process, the ON/OFF switching of the first high frequency power is synchronized with the ON/OFF switching of the second high frequency power. Accordingly, the first high frequency power is applied to the lower electrode LE in the first process while being switched ON and OFF cyclically, whereas, in the second process, the first high frequency power is applied to the lower electrode while being maintained ON continuously. Furthermore, in the first process and the second process, even when the first high frequency power is maintained ON, the same effect can be achieved in the aspect of uniformity of a deposit originated from the processing gas.

Further, when switching the high frequency power ON and OFF cyclically, a switching frequency is set to be in a range from 5 kHz to 30 kHz (in the present exemplary embodiment, 5 kHz), and a duty ratio is set to be in a range from 60% to 90% (in the present exemplary embodiment, 50%).

Here, in the exemplary embodiment, the first process (the first period T1) and the second process (the second period T2) are performed alternately. As a result, it is possible to allow the deposits, which are originated from the processing gas and stuck to the inner surface of the hole (or groove) formed by the etching, to be uniform from the vicinity of a top portion of the opening to a bottom portion thereof.

Figure 3A:
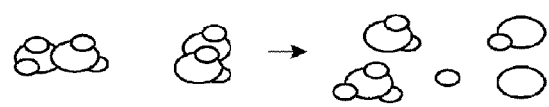
FIG. 3A and FIG. 3B are diagrams showing a state of fluorocarbon and a sticking manner in which deposits are stuck, respectively, according to the comparative example.
Figure 3B:
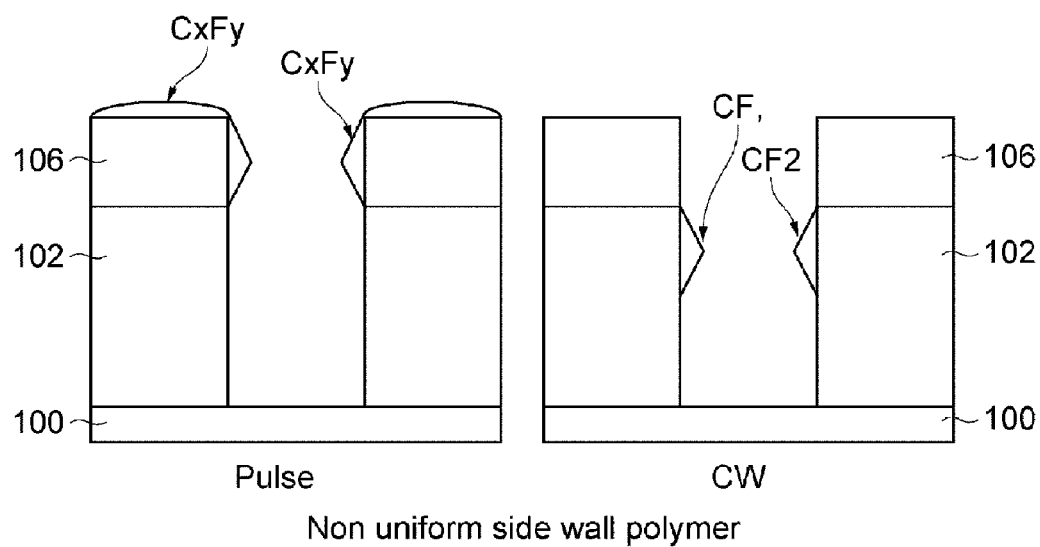

Further, it is desirable that the T1 and the T2 are set to be in a range from 10 sec to 60 sec (T1=10 sec~60 sec, T2=10 sec~60 sec). Thus, the deposits, which are originated from the processing gas and stuck to the inner surface of the hole (or groove) formed by the etching can be formed from the vicinity of the top portion of the opening to the bottom portion such that the amounts of the deposits at respective positions on the inner surface of the hole (groove) are uniform. More specifically, in the comparative example, the molecule (in this example, $C_4F_6$) of fluorocarbon ($C_xF_y$: x and y are appropriate integers) is not decomposed to molecules such as CF, $CF_2$, $CF_3$ and F as illustrated in FIG. 3A during the first period T1 while the pulse power is applied. In this case, since an adhesive strength of the fluorocarbon is high, the fluorocarbon tends to be stuck to the vicinity of the opening of the mask 106, that is, stuck to a top surface and an inner surface of the mask 106, as illustrated in the left diagram of FIG. 3B.

Further, during the second period T2 while the power is continuously applied, decomposition of the fluorocarbon into the molecules such as CF, $CF_2$, $CF_3$ and F progresses, as illustrated in FIG. 3A. In such a case, the adhesive strength of the fluorocarbon is deteriorated, and the fluorocarbon tends to be stuck to an inner surface of the etching target layer 102, as illustrated in the right diagram of FIG. 3B.

Figure 5A:
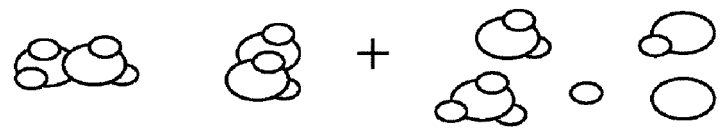
FIG. 5A and FIG. 5B are diagrams showing a state of fluorocarbon and a sticking manner in which deposits are stuck, respectively, according to the exemplary embodiment.
Figure 5B:
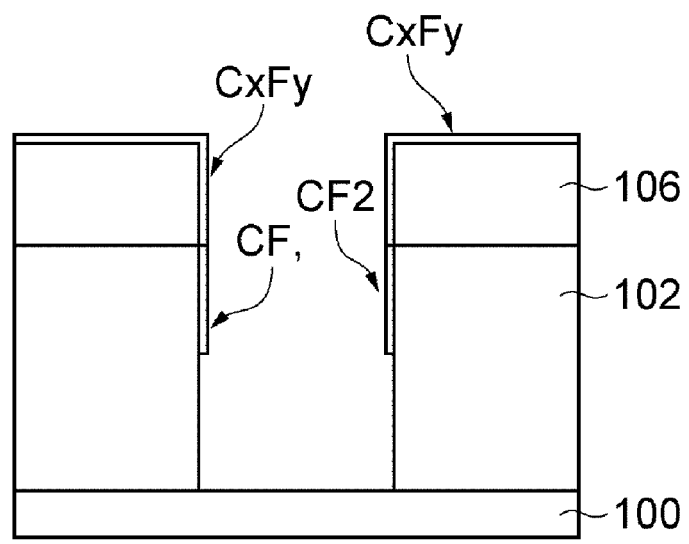

Meanwhile, in the exemplary embodiment, the molecule (in the present example, $C_4F_6$) of fluorocarbon ($C_xF_y$: x and y are appropriate integers) and the molecules such as CF, $CF_2$, $CF_3$ and F decomposed from the fluorocarbon are provided in the processing vessel concurrently, as illustrated in FIG. 5A. In such a case, the fluorocarbon is stuck to the vicinity of the opening of the mask 106, while the molecules such as CF, $CF_2$, $CF_3$ and F are concurrently stuck to the inner surface of the etching target layer 102, as depicted in FIG. 5B.

That is, the deposits, which are originated from the processing gas and stuck to the inner surface of the hole (or groove) formed by the etching, are formed from the vicinity of the top portion of the opening to the bottom portion thereof, and the amount (thickness) of the deposits over the entire inner surface of the hole (or groove) becomes uniform.

As stated above, in the above-described plasma etching method, the fluorocarbon-containing processing gas is introduced into the processing vessel in which the processing target object is provided, and the first high frequency power (having a frequency appropriately selected within a range from 27 MHz to 100 MHz) for excitation of the processing gas into plasma and the second high frequency power for attraction of ions to the processing target object are applied between the electrodes within the processing vessel. Here, the second high frequency power has a frequency (appropriately selected within a range from 400 kHz to 13.56 MHz) lower than that of the first high frequency power. The processing target object is etched by the generated plasma. This plasma etching method includes the first process of applying, while applying the first high frequency power to the lower electrode, the second high frequency power to the lower electrode while switching the second high frequency power ON and OFF cyclically; and the second process of applying, while applying the first high frequency power to the lower electrode, the second high frequency power to the lower electrode while maintaining the second high frequency power ON continuously. The first process and the second process are alternately performed such that the deposits, which are originated from the processing gas and stuck to the inner surface of the hole (or groove) formed by the etching, are uniformly formed from the vicinity of the top portion of the opening to the bottom portion thereof.

In this case, if the deposits are formed on the inner surface of the hole (or groove) H formed by the etching, the inner surface of the hole (or groove) is protected by the deposits from the ions introduced into the hole (or groove). Therefore, etching of the inner surface (sidewall surface) of the hole (or groove) can be suppressed, and, thus, the twisting of the hole or the groove can also be suppressed (see FIG. 6B).

Furthermore, in the first process and the second process, the ON/OFF switching of the first high frequency power is synchronized with the ON/OFF switching of the second high frequency power. In this case, it is possible to stabilize the plasma, as compared to a case in which they are not synchronized.

In the above-described exemplary embodiment, the apparatus in which dual frequency powers RF are applied to the lower electrode within the processing vessel is used as the substrate processing apparatus. However, the exemplary embodiment is not limited thereto and also applicable to an apparatus in which the dual high frequency powers RF are applied to an upper electrode within the processing vessel.

Moreover, the processing target object has the etching target layer 102 made of a multilayered film; and the mask 106 formed on the multilayered etching target layer 102. Here, the multilayered film includes the first film and the second film, which have different dielectric constants and are stacked alternately on top of each other. Appropriately, the first film is a silicon oxide film ($SiO_2$) and the second film is a silicon nitride film ($SiN_X$: X is a composition of nitrogen (N)). That is, though the first film is a silicon oxide film and the second film is a silicon nitride film in the present exemplary embodiment, other materials may also be used. By way of example, the first film may be a silicon oxide film and the second film may be a polysilicon film. Especially, when using these silicon-based materials, the same effects as described above can be achieved. Further, the first film and the second film may be stacked in a total number of 24 layers or more. In addition, though the mask 106 is described to be made of amorphous carbon, other materials may also be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

I claim:

1. A plasma etching method of introducing a processing gas containing fluorocarbon into a processing vessel in which a processing target object is provided; applying a first high frequency power for excitation of the processing gas into plasma and a second high frequency power for attraction of ions to the processing target object, which has a frequency lower than a frequency of the first high frequency power, between electrodes within the processing vessel; and etching the processing target object by the generated plasma, the plasma etching method comprising:

a first process of applying, while applying the first high frequency power to the electrode, the second high frequency power to the electrode while switching ON/OFF of the second high frequency power cyclically; and a second process of applying, while applying the first high frequency power to the electrode, the second high frequency power to the electrode while maintaining the second high frequency power ON continuously, wherein the processing target object includes a multilayered film in which a first film and a second film having different permittivities are alternately stacked on top of each other; and a mask formed on the multilayered film, the first process and the second process are alternately performed such that deposits, which are originated from the processing gas and stuck to an inner surface of a hole or a groove formed by the etching, are uniformly formed from a vicinity of a top portion of the hole or the groove to a bottom portion of the hole or the groove, and a first period during which the first process is performed and a second period during which the second process is performed are set to have a range from 10 sec to 60 sec and have a range 10 sec to 60 sec, respectively.

2. The plasma etching method of claim 1, wherein the processing gas containing the fluorocarbon contains a $C_4F_6$ gas, a $CH_2F_2$ gas and an $O_2$ gas.

3. The plasma etching method of claim 1, wherein ON/OFF switching of the first high frequency power is synchronized with ON/OFF switching of the second high frequency power in the first process and the second process.

4. The plasma etching method of claim 1, wherein the first film is a silicon oxide film, and the second film is a silicon nitride film.

5. The plasma etching method of claim 1, wherein the first film is a silicon oxide film, and the second film is a polysilicon film.

6. The plasma etching method of claim 1, wherein the first film and the second film are stacked in twenty four layers or more in total.

7. The plasma etching method of claim 1, wherein the mask is made of amorphous carbon.

* * * * *